US007985978B2

(12) United States Patent
Chiou

(10) Patent No.: US 7,985,978 B2
(45) Date of Patent: Jul. 26, 2011

(54) DISPLAY AND PIXEL CIRCUIT THEREOF

(75) Inventor: Yu-Wen Chiou, Tainan (TW)

(73) Assignee: Himax Technologies Limited (TW)

( * ) Notice: Subject to any disclaimer, the term of this patent is extended or adjusted under 35 U.S.C. 154(b) by 277 days.

(21) Appl. No.: 11/736,249

(22) Filed: Apr. 17, 2007

(65) Prior Publication Data

US 2008/0259064 A1 Oct. 23, 2008

(51) Int. Cl.
*H01L 33/00* (2010.01)
*G09G 3/32* (2006.01)

(52) U.S. Cl. .......................................... 257/98; 345/82

(58) Field of Classification Search .................... 438/82, 438/76, 92, 46, 83; 345/169.4, 169.1, 169.3; 340/815.45

See application file for complete search history.

(56) References Cited

U.S. PATENT DOCUMENTS

| | | | | |
|---|---|---|---|---|
| 5,767,827 | A * | 6/1998 | Kobayashi et al. | 345/87 |
| 5,780,878 | A * | 7/1998 | Bhatnagar et al. | 257/139 |
| 6,229,506 | B1 * | 5/2001 | Dawson et al. | 345/82 |
| 6,420,988 | B1 * | 7/2002 | Azami et al. | 341/144 |
| 6,480,179 | B1 * | 11/2002 | Akimoto | 345/92 |
| 6,608,653 | B2 * | 8/2003 | Shiga et al. | 349/43 |
| 7,173,585 | B2 * | 2/2007 | Weng | 345/82 |
| 2003/0034939 | A1 * | 2/2003 | Moon | 345/76 |
| 2003/0107565 | A1 * | 6/2003 | Libsch et al. | 345/211 |
| 2006/0023551 | A1 * | 2/2006 | Peng et al. | 365/226 |

* cited by examiner

*Primary Examiner* — Howard Weiss
*Assistant Examiner* — Steven H Rao
(74) *Attorney, Agent, or Firm* — Baker & McKenzie LLP

(57) ABSTRACT

A display panel is disclosed. The display panel includes a data line, a scan line, a first switch connected to a first voltage, a second switch connected to a second voltage, and a pixel. The pixel is further comprised of a data transistor having a first source/drain electrode connected to said data line, a gate electrode connected to said scan line and a second source/drain electrode, a driving transistor having a first source/drain electrode connected via a first switch to the first voltage, a gate electrode connected via the second switch to the second voltage and a second source/drain electrode, a storage capacitor having a first electrode connected to the gate electrode of the driving transistor and a second electrode connected to the first source/drain electrode of the driving transistor and to the second source/drain electrode of the data transistor, and a lighting device having an anode electrode connected to the second source/drain electrode of said driving transistor and a cathode electrode connected to a third voltage.

19 Claims, 4 Drawing Sheets

DISPLAY AND PIXEL CIRCUIT THEREOF

BACKGROUND

I. Field of the Invention

The present invention relates generally to the field of visual display devices, and more particularly to a pixel circuit of a display.

II. Background of the Invention

A visual display device constitutes one part of the functional modules in almost every electronic apparatus and plays an important role in facilitating human-machine interactions with that apparatus. It helps users to read information from the apparatus via the display device and further to control the apparatus operation. As newer generations of display devices continue to be developed, they are becoming both thinner and lighter. Display technology has progressed from conventional Cathode Ray Tube (CRT) displays to flat-panel display devices such as liquid crystal displays (LCD) or organic light emitting displays (OLED), which take advantage of advances in photoelectron and semiconductor manufacturing technologies.

In particular, active matrix organic light emitting diode (AMOLED) display technology has attracted a lot of attention and is subjected to intense research. AMOLED displays utilize transistors, for example implemented by thin-film transistor (TFT) techniques, to drive the organic light emitting diode. AMOLED displays conventionally include a mesh of scan and data lines that defines an array of pixels, each of which has one light-emitting device. The light-emitting device is usually driven by a pixel circuit associated to each pixel. In order to control individual pixels, a specific pixel is commonly selected via a scan line and a data line, and an appropriate operating voltage is also provided, so as to display the display information corresponding to each pixel.

FIG. 1 is a schematic diagram that illustrates a conventional 2T1C (two transistors and one capacitor per pixel) pixel circuit of an AMOLED.

As shown in FIG. 1, the pixel circuit includes a data transistor 11, a driving transistor 12, a storage capacitor 13 and a lighting device 14. The transistors can be any type of transistor, such as a thin film transistor or the like. For example, the data transistor 11 can be a n-type metal-oxide-semiconductor (NMOS) transistor and the driving transistor 12 can be a p-type metal-oxide-semiconductor (PMOS) transistor in the following descriptions. The data transistor 11 has a gate electrode connected to a scan line and a first source/drain electrode connected to a data line. The driving transistor 12 has a gate electrode connected to a second source/drain electrode of the data transistor 11 and a first source/drain electrode connected to a power source VDD. The storage capacitor 13 is connected to between the gate electrode of the driving transistor 12 and the first source/drain electrode of the driving transistor 12. The lighting device 14 has an anode electrode connected to a second source/drain electrode of the driving transistor 12 and a cathode electrode connected to a ground level.

During operation, a high voltage level scan signal turns on the data transistor 11, which enables the data signal to charge the storage capacitor 13. The voltage potential that stores within the storage capacitor 13 determines the magnitude of the current flowing through the driving transistor 12, so that the lighting device can emit the light based on the current. As to the conventional driving method mentioned above, the driving transistor 12 and the lighting device 14 are all kept in an activation state both at programming and display stages.

Therefore, deviation of the driving voltage of the lighting device 14 is generated which impacts the display quality.

However, it is difficult to consistently maintain the luminance of a display due to the following disadvantages of the conventional pixel circuit. (1) The stored voltage potential of the storage capacitor 13 during the programming stage may not be accurate due to the IR drop of the power line, which extends from the power source VDD to the driving transistor 12. In the programming stage, the voltage potential of the storage capacitor 13 is determined by the voltage difference between the data line and the first source/drain electrode of the driving transistor 12, which connected to the voltage source VDD. Since the voltage at the first source/drain electrode of the driving transistor 12 may vary from that of other pixel circuits, the voltage potential stored in the storage capacitor 13 may not be accurate. (2) The clock feed-through effect may occur while the data transistor 11 is being turned off, such that the voltage potential of the storage capacitor 12 is altered.

Therefore, there is a need for an alternative 2T1C pixel circuit design that could solve or improve the above-mentioned drawbacks.

SUMMARY OF THE INVENTION

Systems, methods, and apparatuses for an improved pixel driving circuit are disclosed. In order to overcome the disadvantages of the conventional method, the present invention provides an improved 2T1C pixel driving circuit featuring a new circuit structure and signals switch off capability.

In one aspect, a display panel is disclosed. The display panel includes a data line, a scan line, a first switch connected to a first voltage, a second switch connected to a second voltage, and a pixel. The pixel is further comprised of a data transistor having a first source/drain electrode connected to said data line, a gate electrode connected to said scan line and a second source/drain electrode, a driving transistor having a first source/drain electrode connected via a first switch to the first voltage, a gate electrode connected via the second switch to the second voltage and a second source/drain electrode, a storage capacitor having a first electrode connected to the gate electrode of the driving transistor and a second electrode connected to the first source/drain electrode of the driving transistor and to the second source/drain electrode of the data transistor, and a lighting device having an anode electrode connected to the second source/drain electrode of said driving transistor and a cathode electrode connected to a third voltage.

In another aspect, a driving method for a display having a mesh of scan and data lines and an array of pixels, each pixel including a lighting device, a driving transistor, a storage capacitor and a data transistor, the storage capacitor is connected between a gate electrode and a first source/drain electrode of the driving transistor, a second source/drain electrode of the driving transistor being connected to the lighting device. The method including the steps of programming the pixel. The first source/drain electrode of the driving transistor is disconnected from a power supply source. The gate electrode of the driving transistor is connected to a reference voltage. The scan signal of the scan line corresponding to the pixel is asserted. The data signal from the corresponding data line is supplied to the storage capacitor.

In still another aspect, a pixel circuit for a display panel is disclosed. The pixel circuit includes a data transistor, a driving transistor, a storage capacitor, and a lighting device. The data transistor has a first source/drain electrode that is connected to a data line, a gate electrode that is connected to a scan line, and a second source/drain electrode. The driving transistor has a first source/drain electrode that is connected via a first switch to a first voltage, a gate electrode connected via a second switch to a second voltage and a second source/drain electrode, wherein the first source/drain electrode of the driving transistor is further connected to the second source/drain electrode of the data transistor. The storage capacitor is connected between the gate electrode of the driving transistor and the first source/drain electrode of the driving transistor. The lighting device has an anode electrode connected to the second source/drain electrode of the driving transistor and a cathode electrode that is connected via a third switch to a third voltage.

Some advantages of the present invention are: (1) a minimized effect due to the power line IR drop during the programming stage; (2) an adjustable data range for the voltage potential of the storage capacitor; and (3) a reduced impact of the clock feed-through effect. These and other features, aspects, and embodiments of the invention are described below in the section entitled "Detailed Description."

BRIEF DESCRIPTION OF THE DRAWINGS

The accompanying drawings, which are incorporated in and constitute part of this specification, illustrate various embodiments of the invention and together with the description serve to explain the principles of the invention.

DETAILED DESCRIPTION

Reference is made in detail to embodiments of the invention. While the invention is described here in terms of embodiments, the invention is not intended to be limited to just these embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, as is obvious to one of ordinary skilled in the art, the invention may be practiced without these specific details. In other instances, well-known methods, procedures, components, and circuits have not been described in detail so that aspects of the invention will not be obscured.

Various embodiments of the present invention disclose a display having 2T1C pixel circuits featuring a new circuit structure, and having switches for better control capability such that the display can maintain consistent luminance. The proposed 2T1C pixel circuit comprises a data transistor, a driving transistor, a storage capacitor, and a lighting device.

First Embodiment

Figure 1:
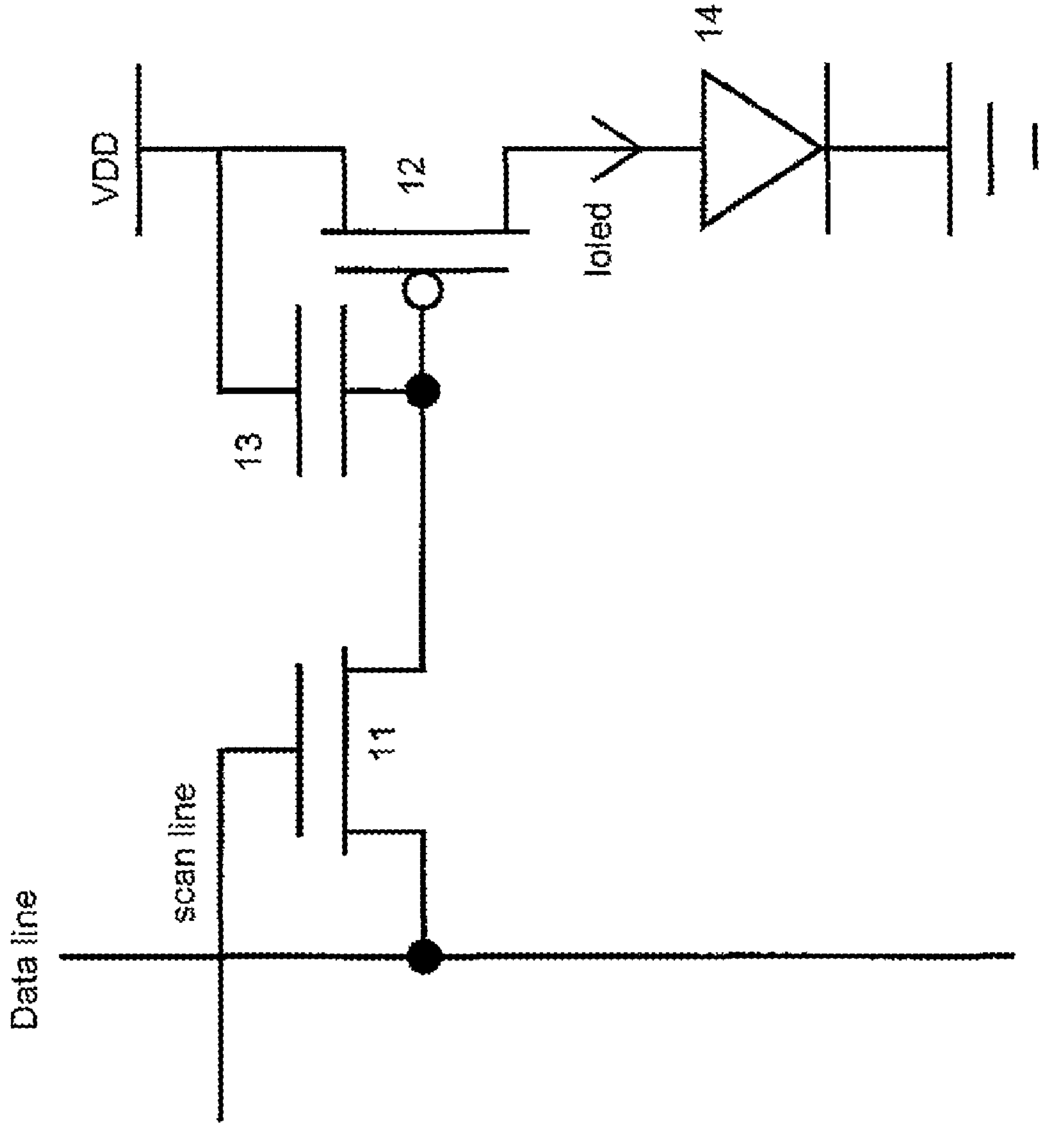
FIG. 1 (RELATED ART)
FIG. 1 illustrates a schematic diagram of a conventional AMOLED circuit that drives a corresponding pixel, in accordance with one embodiment.
Figure 2B:
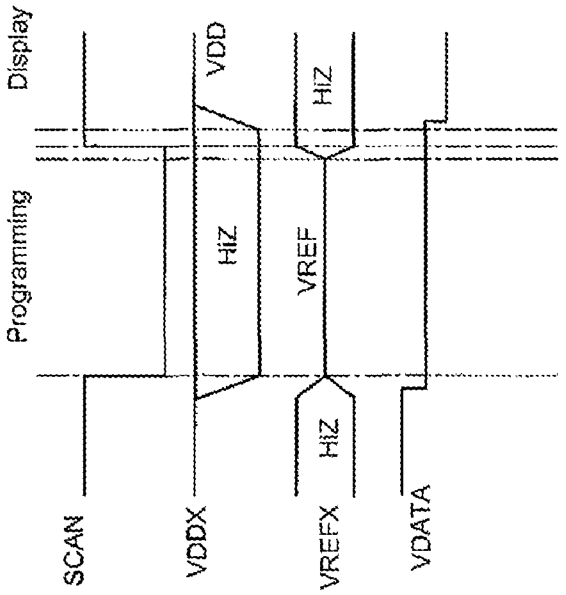
FIG. 2A illustrates a schematic diagram of an AMOLED circuit that drives a corresponding pixel associated with a timing diagram of FIG. 2B in accordance with one embodiment of the present invention, in accordance with one embodiment.
Figure 2A:
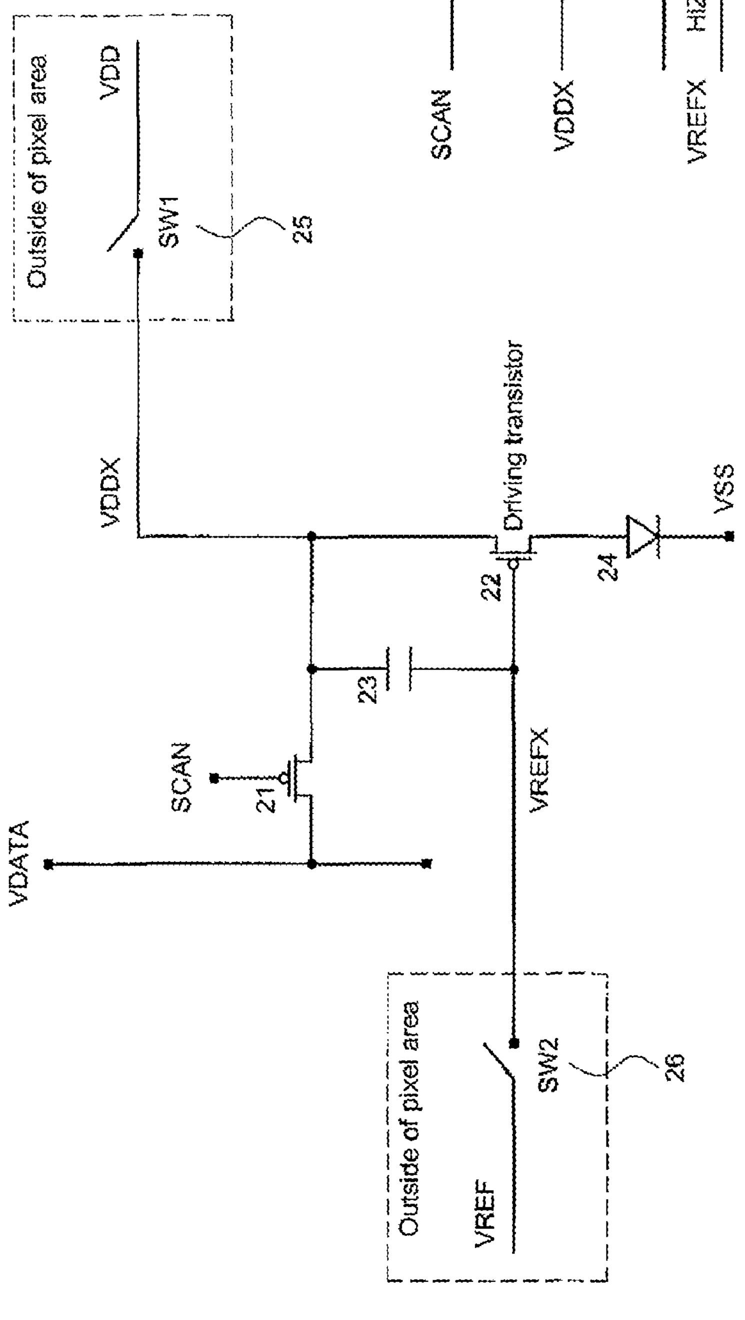

In FIG. 2A, a schematic diagram illustrates an improved AMOLED circuit that drives a corresponding pixel in accordance with one embodiment.

As shown in FIG. 2A, the display includes pixel circuits, a first switch SW1 25 and a second switch SW2 26. Each pixel circuit includes a data transistor 21, a driving transistor 22, a storage capacitor 23, and a lighting device 24. The first switch SW1 25 and the second switch SW2 26 are outside of the pixel area. The transistors of the pixel circuit can be any type of transistor, such as thin film transistor (TFT) or the like. For example, in one embodiment, both the data transistor 21 and the driving transistor 22 are PMOS transistors in the following descriptions. The data transistor 21 has a gate electrode connected to a scan line for receiving a scan signal SCAN, and a first source/drain electrode connected to a data line for receiving a data signal VDATA. The driving transistor 22 has a gate electrode connected to the second switch SW2 26, which is further connected to a reference signal VREF, and a first source/drain electrode connected to the first switch SW1 25, which is further connected to a power supply voltage VDD. The storage capacitor 23 has a first electrode connected to the gate electrode of the driving transistor 22 and a second electrode connected to the first source/drain electrode of the driving transistor 22 and to a second source/drain electrode of the data transistor 21. The lighting device 24, such as an organic light emitting diode, has an anode electrode connected to a second source/drain electrode of the driving transistor 22 and a cathode electrode connected to a ground level VSS or a negative voltage level. A detailed description of the operation of this embodiment will be provided in the following paragraph.

In the programming stage, a high voltage level scan signal SCAN is asserted, the first switch SW1 25 is turned off and the second switch SW2 26 is turned on, such that a data signal VDATA from the data line is transmitted through the data transistor 21 to charge the storage capacitor 23. The voltage potential of the storage capacitor 23 is determined by the voltage difference between the data signal VDATA and the level of the reference signal VREF. In the display stage, the second switch SW2 26 is turned off, the scan signal SCAN is unasserted and then the first switch SW1 25 is turned on. The voltage potential that stores within the storage capacitor 23 determines the magnitude of the current flowing through the driving transistor 12, so that the lighting device 24 can emit the light based on the current.

In FIG. 2B, a timing diagram of related signals that apply to the AMOLED is illustrated.

As shown in FIG. 2B, the timing diagram describes signals of SCAN, VDDX, VREFX, and VDATA, in accordance with one embodiment. In the programming stage, the scan signal SCAN is asserted, the first switch SW1 25 is turned off and the second switch SW2 26 is turned on. The scan signal SCAN is kept at a negative high voltage level. The first switch SW1 25 is turned off such that the node of the signal VDDX is at a high impedance. The second switch SW2 26 is turned on such that the level of the signal VREFX is equal to that of the reference signal VREF. Then, the voltage potential that stores within the storage capacitor 23 is determined by the data signal VDATA and the reference signal VREF.

In the display stage, the second switch SW2 26 is turned off, the scan signal SCAN is unasserted, and the first switch SW1 25 is turned on. The node of the signal VREFX is at high impedance and the signal VDDX is equal to the power supply voltage VDD. The voltage between the capacitor 23 determines the magnitude of the current flowing through the driving transistor 22, and then the luminance of the lighting device 24 is determined based on the current.

Second Embodiment

Figure 3B:
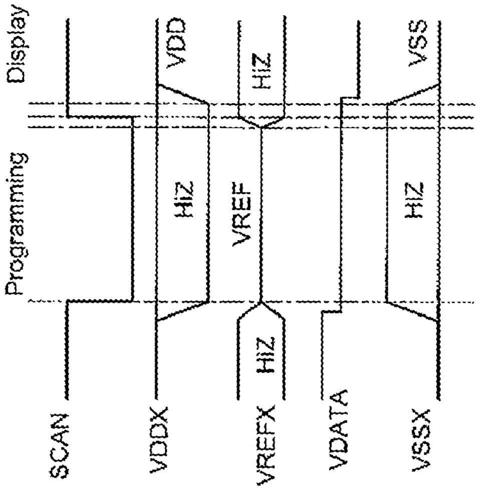
FIG. 3A illustrates a schematic diagram of an AMOLED circuit that drives a corresponding pixel associated with a timing diagram of FIG. 3B in accordance with one embodiment of the present invention, in accordance with one embodiment.
Figure 3A:
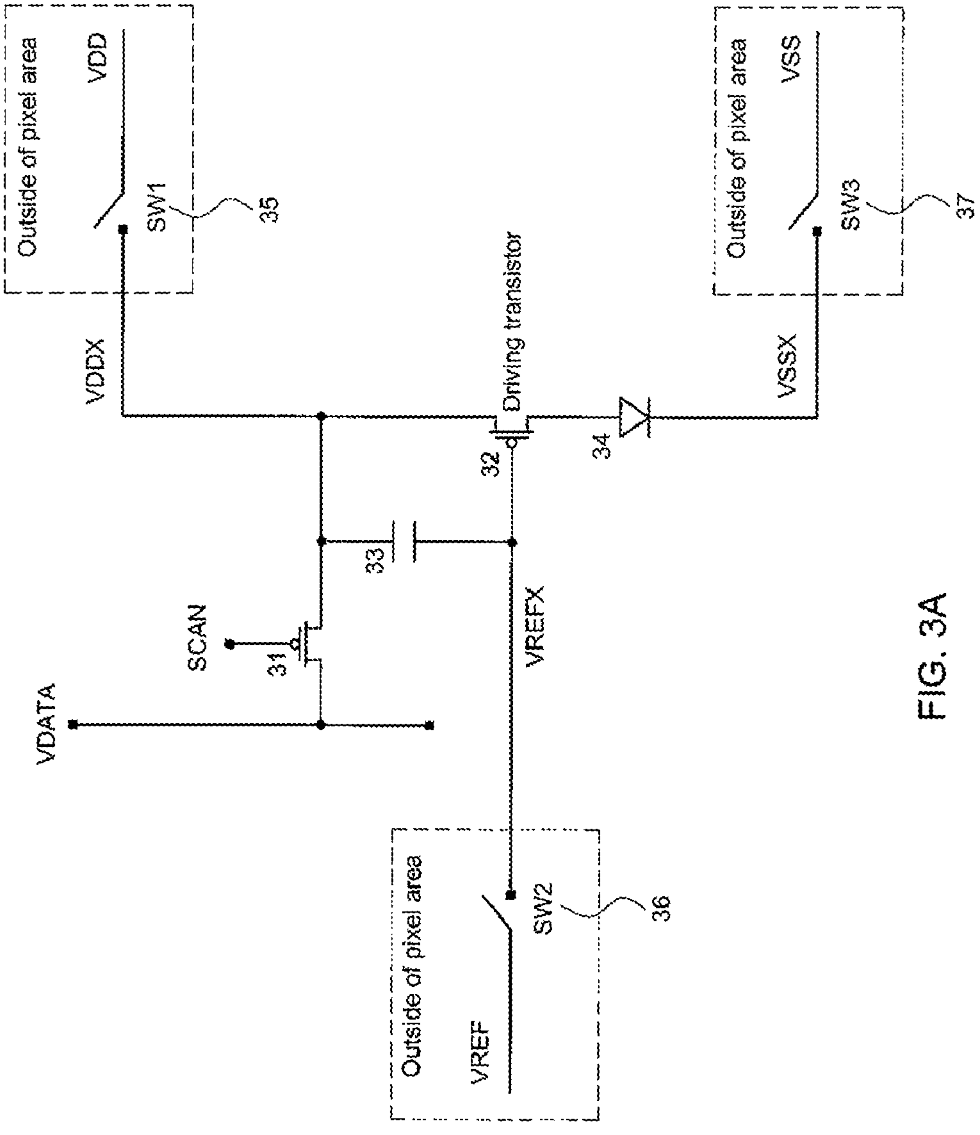

In FIG. 3A, a schematic diagram illustrates an improved AMOLED circuit that drives a corresponding pixel, in accordance with one embodiment.

As shown in FIG. 3A, the display includes pixel circuits, a first switch SW1 35, a second switch SW2 36 and a third switch SW3 37. Each pixel circuit includes a data transistor 31, a driving transistor 32, a storage capacitor 33, and a lighting device 34. The first switch SW1 35, the second switch SW2 36 and the third switch SW3 37 are at the outside of the pixel area. The transistors can be any type of transistor, such as thin film transistor or the like. For example, in one embodiment, both the data transistor 31 and the driving transistor 32 are PMOS transistors in the following descriptions. The data transistor 31 has a gate electrode connected to a scan line for receiving a scan signal SCAN, and a first source/drain electrode connected to a data line for receiving a data signal VDATA. The driving transistor 32 has a gate electrode connected to the second switch SW2 36, which further connected to a reference signal VREF and a first source/drain electrode connected to the first switch SW1 35, which further connected to a power supply voltage VDD. The storage capacitor 33 has a first electrode connected to the gate electrode of the driving transistor 32 and to the second switch SW2 36 and a second electrode connected to the first source/drain electrode of the driving transistor 32, to the first switch SW1 35 and to a second source/drain electrode of the data transistor 31. The lighting device 34, such as an organic light emitting device, has an anode electrode connected to a second source/drain electrode of the driving transistor 32 and a cathode electrode connected to the third switch SW3 37, which further connected to a ground level VSS or a negative voltage level. A detailed description of the operation of this embodiment will be provided in the following paragraph.

In the programming stage, a high voltage level scan signal SCAN is asserted, the first switch SW1 35 and the third switch SW3 37 are turned off and the second switch SW2 36 is turned on, such that a data signal VDATA from the data line is transmitted to the storage capacitor 33 and charges the storage capacitor 33. The voltage potential of the storage capacitor 33 is determined by the voltage difference between the data signal VDATA and the level of reference signal VREF. Due to the third switch SW3 37 cut off, there is no continuous current leakage flowing through the current path of the driving transistor 32 and the lighting device 34. In the display stage, the second switch SW2 36 is turned off, then the scan signal SCAN is unasserted and then the first switch SW1 35 and the third switch SW3 37 are turned on. The voltage potential that stores within the storage capacitor 33 determines the magnitude of the current flowing through the driving transistor 32, so that the lighting device 24 can emit the light based on the current.

In FIG. 3B, a timing diagram of related signals that apply to the AMOLED is illustrated, in accordance with one embodiment.

As shown in FIG. 3B, the timing diagram describes signals of SCAN, VDDX, VREFX, VDATA, and VSSX. In the programming stage, the scan signal SCAN is asserted, the first switch SW1 35 and the third switch SW3 37 are turned off and the second switch SW2 36 is turned on. The scan signal SCAN is kept at a negative high voltage level. The first switch SW1 35 and the third switch SW3 37 are turned off such that the node of the signals VDDX and VSSX are at high impedance. The second switch SW2 36 is turned on such that the level of the signal VREFX is equal to that of the reference signal VREF. Then, the voltage potential that stores within the storage capacitor 33 is determined by the data signal VDATA and the reference signal VREF. In the display stage, the second switch SW2 36 is turned off, the scan signal SCAN is unasserted, and the first switch SW1 35 and the third switch SW3 37 are turned on. The node of the signal VREFX is at high impedance, the signal VDDX is equal to the power supply voltage VDD, and the signal VSSX is equal to the signal VSS. The voltage between the capacitor 33 determines the magnitude of the current flowing through the driving transistor 32, and then the luminance of the lighting device 24 is determined based on the current.

Third Embodiment

Figure 4B:
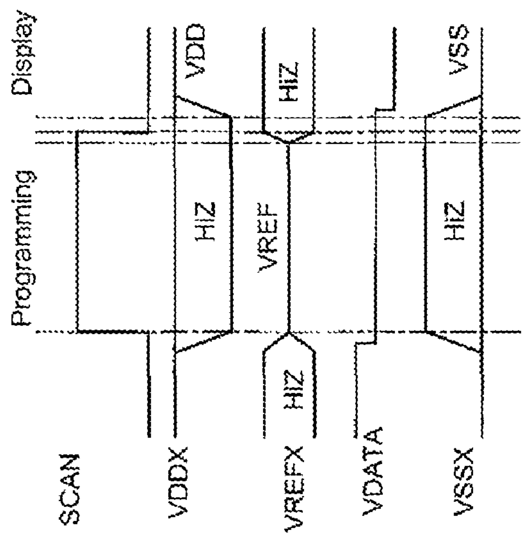
FIG. 4A illustrates a schematic diagram of an AMOLED circuit that drives a corresponding pixel associated with a timing diagram of FIG. 4B in accordance with one embodiment of the present invention, in accordance with one embodiment.
Figure 4A:
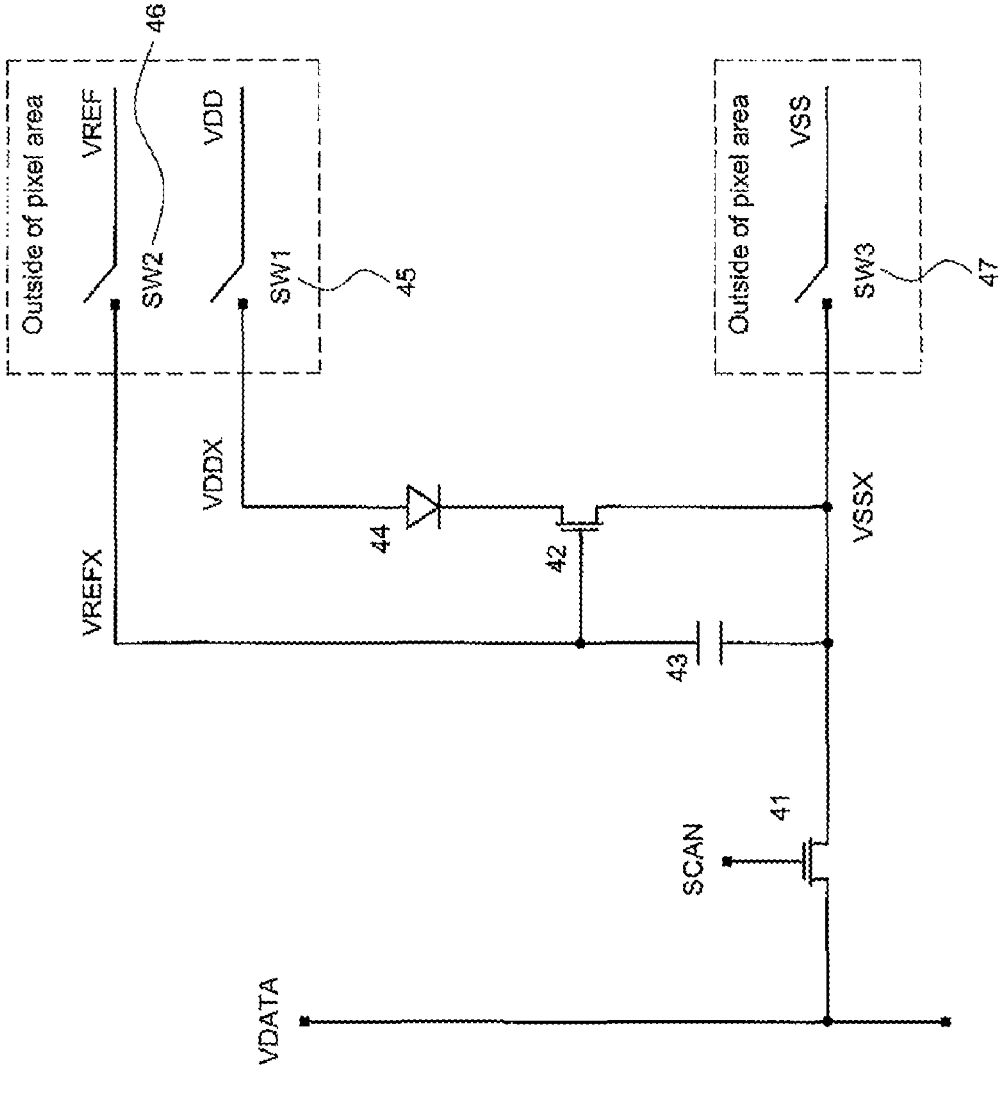

In FIG. 4A, a schematic diagram illustrates an improved AMOLED circuit that drives a corresponding pixel, in accordance with one embodiment.

As shown in FIG. 4A, the display includes pixel circuits, a first switch SW1 45, a second switch SW2 46 and a third switch SW3 47. Each pixel circuit includes a data transistor 41, a driving transistor 42, a storage capacitor 43, and a lighting device 44. The first switch SW1 45, the second switch SW2 46 and the third switch SW3 47 are at the outside of the pixel area. The transistors can be any type of transistor, such as thin film transistor or the like. For example, in one embodiment, both the data transistor 41 and the driving transistor 42 are NMOS transistors in the following descriptions. The data transistor 41 has a gate electrode connected to a scan line for receiving a scan signal SCAN and a first source/drain electrode connected to a data line for receiving a data signal VDATA. The driving transistor 42 has a gate electrode connected to the second switch SW2 46, which further connected to a reference signal VREF and a first source/drain electrode connected to the third switch SW3 47, which further connected to a ground level VSS or a negative voltage level. The storage capacitor 43 has a first electrode connected to the gate electrode of the driving transistor 42 and to the second switch SW2 46 and a second electrode connected to the first source/drain electrode of the driving transistor 42, to the third switch SW3 47 and to a second source/drain electrode of the data transistor 41. The lighting device 44, such as an organic light emitting device, has a cathode electrode connected to a second source/drain electrode of the driving transistor 42 and an anode electrode connected to the first switch SW1 45, which further connected to a power supply voltage VDD. Detailed operation steps of the embodiment are similar to those described in the previous paragraphs.

In FIG. 4B, a timing diagram of related signals that apply to the AMOLED is illustrated, in accordance with one embodiment.

As shown in FIG. 4B, the timing diagram is similar to the timing diagram of FIG. 3B besides in the programming stage, the scan line SCAN is asserted and kept at a positive high voltage level.

The advantages of the embodiments of the present invention which have been described in the above paragraphs are as follows. (1) IR drop of the power line is less influencing since the voltage potential of the storage capacitor is determined by the data signal VDATA and the reference voltage VREF, irrespective of the power supply voltage. (2) The data range of the voltage potential of the storage capacitor is easy to adjust by the control of the reference voltage VREF. (3) The clock feed-through effect is lessened.

Although the embodiments of the invention are illustrated by AMOLEDs, it is not intended to limit thereto. Other types of displays can be implemented according to the invention.

While the invention has been described with reference to various illustrative embodiments, the description is not intended to be construed in a limiting sense. The appended claims will cover any modifications or embodiments as may fall within the scope of the present invention.

What is claimed is:

1. A display panel, comprising:

a data line;

a scan line;

a first switch operable to establish selective electrical connection with a first voltage;

a second switch operable to establish selective electrical connection with a second voltage; and a pixel comprising:

a data transistor having a first source/drain electrode electrically coupled with said data line, a gate electrode electrically coupled with said scan line, and a second source/drain electrode;

a driving transistor having a first source/drain electrode electrically coupled via said first switch with the first voltage, a gate electrode electrically coupled via the second switch with the second voltage, and a second source/drain electrode;

a storage capacitor having a first electrode electrically coupled to, without the presence of any elements therebetween, said gate electrode of said driving transistor, and a second electrode electrically coupled to, without the presence of any elements therebetween, said first source/drain electrode of said driving transistor and said second source/drain electrode of said data transistor, respectively; and a lighting device having an anode electrode electrically coupled to, without the presence of any elements therebetween, the second source/drain electrode of said driving transistor, and a cathode electrode electrically coupled to, without the presence of any elements therebetween, a third voltage.

2. The display panel of claim 1, wherein said first voltage is a power supply voltage, said second voltage is a reference voltage, and said third voltage is one of a grounded voltage or a negative voltage.

3. The display panel of claim 1, wherein said lighting device comprises an organic light emitting device.

4. The display panel of claim 1, wherein while programming the pixel, a scan signal of the scan line is asserted, said first switch is turned off and said second switch is turned on, such that a data signal from the data line is transmitted to said storage capacitor.

5. The display panel of claim 4, wherein while displaying the pixel after programming, said second switch is turned off, then said scan signal is unasserted and then said first switch is turned on.

6. The display panel of claim 1, wherein while displaying the pixel, said second switch is turned off, said scan signal is unasserted, and said first switch is turned on.

7. The display panel of claim 1, wherein said cathode of said lighting device is electrically coupled with the third voltage further via a third switch.

8. The display panel of claim 7, wherein while programming the pixel, the scan signal is asserted, said first switch and said third switch are turned off and said second switch is turned on, such that a data signal from the data line is transmitted to said storage capacitor.

9. The display panel of claim 8, wherein while displaying the pixel after programming, said second switch is turned off, then said scan signal is unasserted and then said first switch and said third switch are turned on.

10. A pixel circuit for a display panel comprising:

a data transistor having a first source/drain electrode electrically coupled with a data line, a gate electrode electrically coupled with a scan line, and a second source/drain electrode;

a driving transistor having a first source/drain electrode electrically coupled, without the presence of any elements therebetween, via a first switch to a first voltage, a gate electrode electrically coupled, without the presence of any elements therebetween, via a second switch to a second voltage and a second source/drain electrode, wherein the first source/drain electrode of the driving transistor is further electrically coupled, without the presence of any elements therebetween, to the second source/drain electrode of the data transistor;

a storage capacitor electrically coupled between said gate electrode of said driving transistor and said first source/drain electrode of said driving transistor, without the presence of any elements therebetween; and a lighting device having an anode electrode electrically coupled, without the presence of any elements therebetween, to the second source/drain electrode of said driving transistor, and a cathode electrode electrically coupled, without the presence of any elements therebetween, via a third switch to a third voltage.

11. The pixel circuit of claim 10, wherein while programming the pixel, the scan signal is asserted, said first switch is turned off, said third switch is turned off and said second switch is turned on, such that a data signal from the data line is transmitted to said storage capacitor.

12. The pixel circuit of claim 10, wherein while displaying the pixel after programming, said second switch is turned off, then said scan signal is unasserted and then said first switch is turned on and said third switch is turned on.

13. A display panel comprising:

a data line;

a scan line; and a pixel comprising:

a first transistor including a first source/drain electrode selectively electrically coupled to a power supply voltage via a first switch, a second source/drain electrode coupled, without the presence of any elements therebetween, to a lighting element, and a gate electrode selectively electrically coupled, without the presence of any elements therebetween, to a reference voltage via a second switch;

a second transistor coupled between the first source/drain electrode and the data line, without the presence of any elements therebetween, wherein the second transistor is operable based on a scan signal applied through the scan line; and a storage capacitor coupled between the first source/drain electrode and the gate electrode, without the presence of any elements therebetween.

14. The display panel of claim 13, wherein said lighting device comprises an organic light emitting device.

15. The display panel of claim 13, wherein the pixel is operable in a programming stage by asserting the scan signal on the scan line, turning off said first switch and turning on said second switch.

16. The display panel of claim 15, wherein the pixel is operable in a display stage by turning off said second switch, discontinuing said scan signal and turning on said first switch.

17. The display panel of claim 13, wherein said lighting device has a first electrode coupled with the second source/drain electrode, and a second electrode selectively electrically coupled with a second reference voltage via a third switch.

18. The display panel of claim 17, wherein the pixel is operable in a programming stage by asserting the scan signal, turning off said first switch and said third switch, and turning on said second switch.

19. The display panel of claim 18, wherein the pixel is operable in a display stage by turning off said second switch, discontinuing said scan signal, and turning on said first switch and said third switch.

* * * * *